United States Patent
Kurihara et al.

(10) Patent No.: US 6,285,627 B1
(45) Date of Patent: Sep. 4, 2001

(54) ADDRESS TRANSITION DETECTOR ARCHITECTURE FOR A HIGH DENSITY FLASH MEMORY DEVICE

(75) Inventors: Kazuhiro Kurihara, Sunnyvale; Thomas T. Shieh, San Jose, both of CA (US)

(73) Assignees: Advanced Micro Devices, Inc., Sunnyvale, CA (US); Fujitsu Limited, Kanagawa (JP)

(*) Notice: Subject to any disclaimer, the term of this patent is extended or adjusted under 35 U.S.C. 154(b) by 0 days.

(21) Appl. No.: 09/663,909

(22) Filed: Sep. 18, 2000

Related U.S. Application Data
(60) Provisional application No. 60/199,589, filed on Apr. 25, 2000.

(51) Int. Cl.[7] .................................................. G11C 8/00
(52) U.S. Cl. ...................... 365/233.5; 365/194; 365/203
(58) Field of Search ................................ 365/233.5, 194, 365/203

(56) References Cited

U.S. PATENT DOCUMENTS

| | | | |
|---|---|---|---|
| 5,072,131 | * 12/1991 | Nakano | 365/231 |
| 5,073,872 | * 12/1991 | Masuda et al. | 365/189.05 |
| 5,263,000 | 11/1993 | Van Buskirk et al. | 365/226 |
| 5,291,446 | 3/1994 | Van Buskirk et al. | 365/189.09 |
| 5,418,479 | * 5/1995 | Sambandam | 365/233.5 |
| 5,612,921 | 3/1997 | Chang et al. | 365/226 |
| 5,708,387 | 1/1998 | Cleveland et al. | 327/536 |
| 5,835,440 | * 11/1998 | Manning | 365/230.06 |
| 5,978,312 | * 11/1999 | Manning | 365/233.5 |
| 6,111,787 | 8/2000 | Akaogi et al. | 365/185.11 |

OTHER PUBLICATIONS

AMD Datasheet for Am29LV640D/Am29LV641D, (first published May 4, 1999—see revision history on last page).
AMD Press Release #9965—"AMD Announces Industry's First 3.0–Volt, 64–Megabit Nor Flash Memory Device", p. 1 of 1, Apr. 26, 1999, ©1999 Advanced Micro Devices, Inc.

* cited by examiner

*Primary Examiner*—Son T. Dinh
(74) *Attorney, Agent, or Firm*—Wagner Murabito &Hao LLP

(57) ABSTRACT

An equalization circuit for an address transition detector of a high density flash memory device is disclosed. The equalization circuit substantially equalizes the electrical characteristics of a particular signal path to those of another signal path wherein these signal paths transmit trigger signals which further generate other signals. The equalization ensures that resultant signals generated from the trigger signals which traverse these signal paths are generated in the same manner and with the same timing no matter which signal path the trigger signal travels down.

12 Claims, 10 Drawing Sheets

*n = 0 to 21
*s = T/B for TOP/BOTTOM ADDRESS.

ATDBX

CEATB

BYATD

Abatd

ADDRESS TRANSITION DETECTOR ARCHITECTURE FOR A HIGH DENSITY FLASH MEMORY DEVICE

REFERENCE TO EARLIER FILED APPLICATION

This application claims the benefit of the filing date pursuant to 35 U.S.C. §119(e) of Provisional Application Ser. No. 60/199,589, filed Apr. 25, 2000, the disclosure of which is hereby incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM).

Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals two or four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

Another problem with existing flash memory devices has been the low density of storage offered as compared with traditional dynamic random access memory ("DRAM"). With the ever increasing need for storage space in modern electronic devices combined with the need to reduce the number of discrete components, there has been a corresponding pressure to increase the amount of storage available on a single flash memory device. This increase in storage density must not come at the expense of reliability.

One way to increase the storage capacity of a flash memory device is to use a core cell with a dual-level floating gate structure. Such a structure allows one core cell to represent more than one bit of information without increasing the size/area of the device. However, such dual-level core cells are difficult to design and implement because they require complex programming, erase and read logic. This is because the multiple voltage levels that can be stored in the cell now represent more than one logical value and the programming, erase and read logic must now be able to discriminate among these voltage levels. This raises concerns with the ability of the flash memory device to reliably store and retrieve data.

SUMMARY

The present invention is defined by the following claims, and nothing in this section should be taken as a limitation on those claims. By way of introduction, the preferred embodiments described below relate to an equalization circuit for equalizing the generation of an address transition detect signal for a high density flash memory device comprising an array of single level flash memory cells. The equalization circuit includes a first receiver for receiving a first signal transition from a first signal input over a first signal path characterized by a first delay and a second receiver for receiving a second signal transition from a second signal input over a second signal path characterized by a second delay, wherein the second delay is shorter than the first delay The equalization circuit further includes an equalizer coupled with the second signal path. The equalizer is operative to substantially equalize the first delay to the second delay.

The preferred embodiments also relate to a method of synchronizing the generation of an address transition detect signal for a high density flash memory device comprising an array of single level flash memory cells. The method includes: transmitting a first signal over a first signal path characterized by a first delay; transmitting a second signal over a second signal path characterized by a second delay, where the second delay is less than the first delay; and equalizing the second delay and the first delay such that the first delay is substantially equivalent to the second delay.

BRIEF DESCRIPTION OF THE DRAWINGS

FIG. 11 depicts a schematic diagram of a preferred ADBU_FE circuit for use with the architecture of FIG. 3.

DETAILED DESCRIPTION OF THE PRESENTLY PREFERRED EMBODIMENTS

Herein, the phrase "coupled with" is defined to mean directly connected to or indirectly connected with through one or more intermediate components. Further, as used herein, the phrase "high logic level" is used to indicate a logic level of 1 and the phrase "low logic level" is used to indicate a logic level of 0. It will be understood that the signals underlying these representations are actually represented by voltage values. A signal is said to be "asserted" when it has a value which is significant to the logic it is driving. Some signals are asserted when they are at a low logic level (also referred to as "active low") and some signals are asserted when they are at a high logic level (also referred to as "active high"). It will be appreciated that all forms of digital logic representation are contemplated including mixed logic. It will further be appreciated that the underlying voltages of the logic signals may also vary, with typical values being 2 or 3 Volts representing a logic 1 and 0 Volts representing logic 0.

Figure 1:
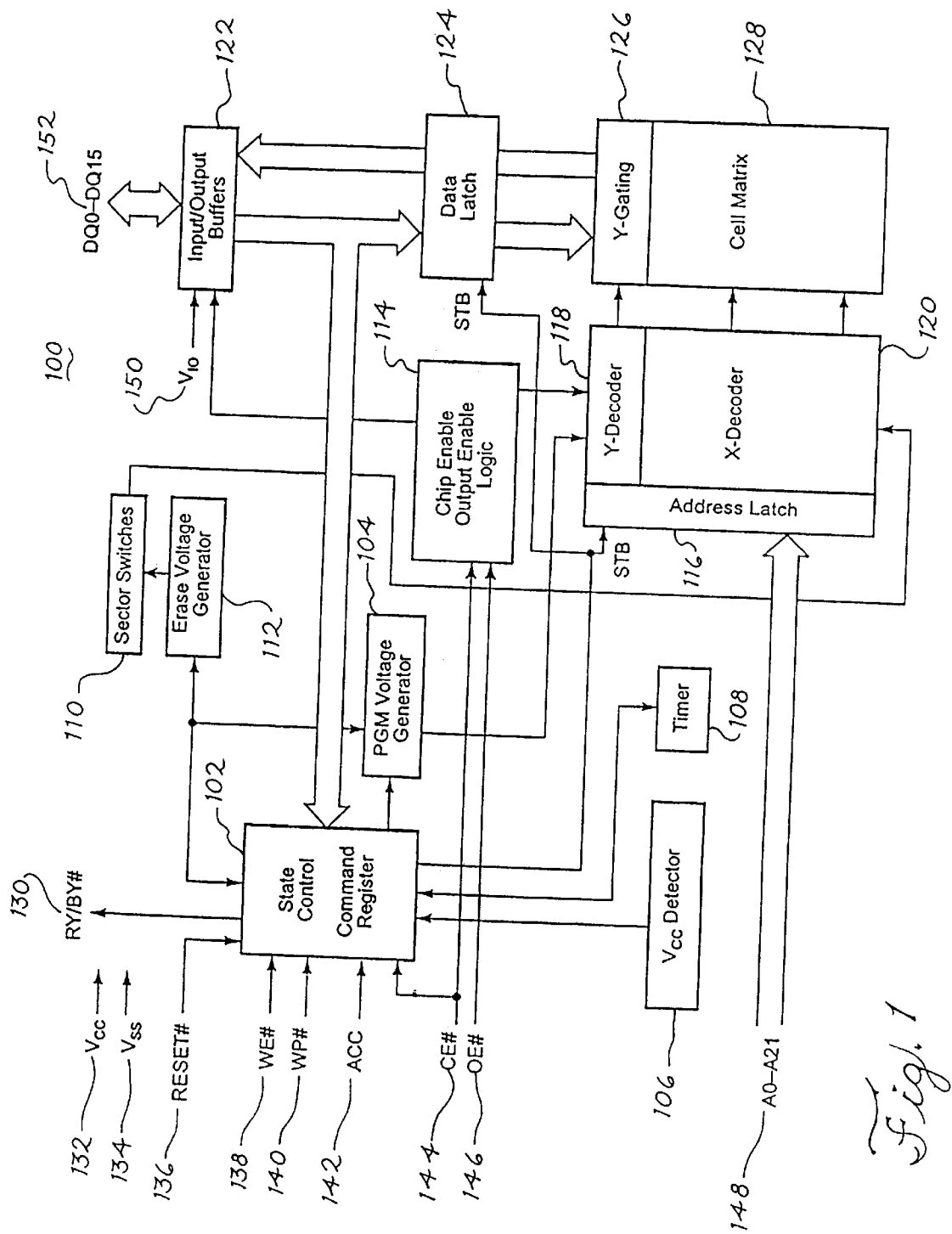
FIG. 1 depicts a block diagram of a 64 Mb flash memory chip according to the present invention.

Referring now to the Figures and in particular, FIG. 1, there is schematically shown a flash memory device 100 according to the present invention that provides 64 megabits (Mb) of storage using a single level NOR type flash memory cell. An exemplary flash memory device 100 is the Am29LV640DU and Am29LV641DU 64 Mb flash memory chips manufactured by Advanced Micro Devices, Inc., located in Sunnyvale, Calif. These devices are discussed in more detail in "Advance Information: Am29LV640DU/Am29LV641DU 64 Megabit (4 M×16-Bit) CMOS 3.0 Volt-only Uniform Sector Flash Memory with Versatile I/O™ Control," published by Advanced Micro Devices, Inc., located in Sunnyvale, Calif., herein incorporated by reference.

The exemplary flash memory device 100 utilizes a single level NOR flash memory cell which is fabricated using a 0.25 μm technology. This allows higher densities and smaller die sizes. In addition single level NOR flash memory cells require less complex programming, erase and read logic versus dual level memory cells. Further, it is easier to ensure uniform cell performance across a large array of single level NOR cells. For example, it is easier to ensure that cells of the array have a uniform threshold voltage, Vt.

The device 100 includes a state control and command register 102, a program voltage generator 104, a Vcc detector 106, a timer 108, sector switches 110, an erase voltage generator 112, chip and output enable logic 114, an address latch 116, a Y-decoder 118, an X-decoder 120, input/output buffers 122, a data latch 124, Y-gating 126 and the cell matrix/array 128. The device 100 further includes inputs and outputs for ready/busy 130, labeled "RY/BY#", operating power 132, labeled "Vcc", ground 134, labeled "Vss", reset 136, labeled "RESET#", write enable 138, labeled "WE#", write protect 140, labeled "WP#", accelerate 142, labeled "ACC", chip enable 144, labeled "CE#", output enable 146, labeled "OE#", a 22 bit address input bus 148, labeled "A0-A21", output buffer power 150, labeled "Vio", and a 16 bit data input/output bus 152, labeled "DQ0-DQ15". The # following a signal name indicates that this signal is asserted when it has a low logic value (active low). In one embodiment, all of the components of FIG. 1 are contained on a single integrated circuit chip. The operation and use of these input and output signals is further explained in the above mentioned reference. Note that the exemplary flash memory device 100, having 64 megabits (or 8 megabytes) is word addressable and therefore accommodates a 22 bit address input 148 and a 16 bit data input/output 152. It will be appreciated that the data size granularity with which the device 100 can be accessed can vary with the implementation and amount of total storage, with a smaller granularity requiring more input address bits and fewer data input/output bits and vice versa, and all such implementations are contemplated. For example, a device 100, having 64 megabits of storage, which is byte addressable requires 23 address bit inputs 148 and 8 data input/outputs 152. In another alternative, the device 100 supports both word and byte addressing on the same integrated circuit.

The state control and command register 102 includes the state machine and control logic which controls the operation of the device 100. This includes controlling the embedded programming and erase operations as well as other general operations of the device 100, which are discussed in more detail below. The state control and command register is responsive to the reset input 136, the write enable input 138, the write protect input 140, the accelerate input 142 and the chip enable input 144. The reset input is used to perform a hardware reset of the device 100. The write enable input 138 is used to signal the device 100 that data is to be stored in the array 128. The write protect input 140 is used to control the write protect functions of the device 100 which prevent accidental erasure of the contents stored in the array 128. The accelerate input 142 is used to speed up programming and erase functions. The chip enable input 144 is used to enable access to the device 100. The state control and command register further includes a ready/busy output 130 which indicates when the device is busy undergoing an embedded operation.

The PGM voltage generator 104 generates the necessary voltages for programming the flash memory cells of the cell matrix/array 128. The erase voltage generator 112 generates the necessary voltages for erasing the flash memory cells of the array 128. The voltage generators 104 and 112 contain voltage pumps (not shown) and switching multiplexors (not shown) which generate and route the necessary high voltages for erasing and programming flash memory cells as well as generating the necessary voltages for read operations under the direction of the state control and command register 102. These voltage pumps include a VPXGG pump, a voltage booster circuit, a VPPIG pump, a drain pump and a negative pump.

The VPXGG pump is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference.

During read operations, the voltage booster is used to boost the word line voltage while the drain pump is used to boost the bit line voltage prior to sensing the output voltage levels. A more detailed description of one exemplary implementation of a voltage booster circuit can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

The VPPIG pump is a high voltage pump used to pass high voltage to the drain of the memory cells. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference.

The negative pump is used to generate a relatively high negative voltage to the control gates of selected memory cells via the word lines. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

Referring back to FIG. 1, the flash memory device 100 further includes a Vcc detector 106 which detects when normal operating power is applied to the device 100. The Vcc detector 106 signals the state control and command register 102 when proper Vcc is detected. The timer 108 is used by the state control and command register 102 to properly control and synchronize the embedded program and erase operations. The sector switches 110 are used to route the voltages used during the erase operation to the proper sectors which are undergoing erase. The Chip and output enable logic 114 is responsive to the chip enable 144 and output enable 146 inputs. This logic is used to enable the device 100 to receive and pass data via the input/output buffers 122. The address latch 116 receives the address for a read or write operation from the address inputs 148. The address latch 116 latches the address for subsequent decoding. The Y-decoder 118 decodes the column address in the memory array 128 from the address latched in the address latch 116. The X-decoder 120 decodes the row address in the memory array 128 from the address latched in the address latch 116. The input/output buffers 122 buffer read data that is being output and write data that is being input to/from the external data bus 152 of the device 100. The input/output buffers receive power from an external voltage source, Vio 150. The data latch 124 latches and holds data being written to the array 128 coming from the input/output buffers 122 or data being read from the array 128 going to the buffers 122. The data latch 124 holds the data steady so it can be written or output depending on the operation underway. The Y-gating 126 gates the data being read from or written to the array 128. The cell matrix/array 128 includes an array of flash memory cells arranged in a row and column addressable format. Alternatively, the cell matrix/array 128 may include one or more banks to subdivide the accessible memory along with the additional hardware necessary to support multiple banks. The individual memory cells in the array 128 are further sub-grouped into sectors such that one or more sectors may be erased at any given time. In the exemplary flash memory device 100, the array 128 is arranged as 128 64 kilobyte sectors. It will be appreciated that there are many ways to implement the basic structure of the flash memory device 100 including alternate input/output interfaces, alternate memory array structures along with accompanying supporting logic and all such alternatives are contemplated.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state control and command register 102, which uses a command register to manage the commencement of either sequence. The erase and programming operations are only accessed via the command register which controls an internal state machine that manages device operations. Commands are written to the command register via the data inputs 152 to the memory device 100.

In the memory device 100, each memory cell, within the cell array 128, includes a single level nor-type floating gate transistor (not shown). It will be appreciated by those skilled in the art, however, that there are many ways to implement a single level flash memory cell and that the configurations and operating characteristics may vary. It will further be appreciated that the embodiments disclosed herein are generally applicable and not limited to one particular implementation of a single level flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump. An exemplary high positive voltage applied to the source during an erase is approximately 5 volts and an exemplary high negative voltage applied to the control gate/word line by the negative pump is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply and the control gate/word line is connected to a high voltage provided by the VPXGG pump positive power supply. An exemplary high voltage applied to the drain by the VPPIG is approximately 5 Volts while an exemplary high voltage applied to the control gate by the VPXGG pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell requires higher than normal voltages, reading from the cell only requires the availability of the normal supply voltage. To read from the memory cell, the source is connected to ground (also referred to as Vss) and the control gate/word line are connected to the booster power supply. Prior to selecting the transistors for a read, the bit lines are charged up via the drain pump. When the cells turn on (if erased), they will connect their respective bit line to ground, grounding out the bit line. The current value of the memory cell is then sensed from the drain/bit line connection. The booster power supply is used to boost the word lines during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state command and control register 102. This logic 102 controls the multiplexors that place the proper voltages from the various power supplies and Vcc on the memory cell inputs depending on the desired function.

In the flash memory device 100, high storage capacity is achieved by providing a large dense array 128 of single level flash memory cells. Using a smaller manufacturing process technology, each memory cell takes up less space, minimizing the overall size of the array 128. However, with the exemplary density of 64 megabits and the ever escalating nature of such densities, the array 128 is still, overall, relatively large. A large array 128 adds complexities of its own to the design of the memory device 100 as it necessitates an enlargement of the integrated circuit which comprises the device 100. In particular, the routing of control signals to and from the logic which controls the operation of the device 100 and moves data into and out of the array 128 becomes critical.

Signal timing can be degraded over signal paths that are excessively long. Control logic placed in a particular location on the device 100 may have to receive inputs from multiple locations, some of which are close by and others of which are a relatively long distance away. Further, outputs of such control logic may be routed to many locations around the device 100, again, some of which are close by and others or which are a relatively long distance away. The time that a signal takes to travel along a particular signal path is a direct function of the length of the signal path. Logic which receives signals via unequal signal paths will see that the signals which travel over the longer paths are delayed with respect to signals which travel over the shorter paths.

Figure 2:
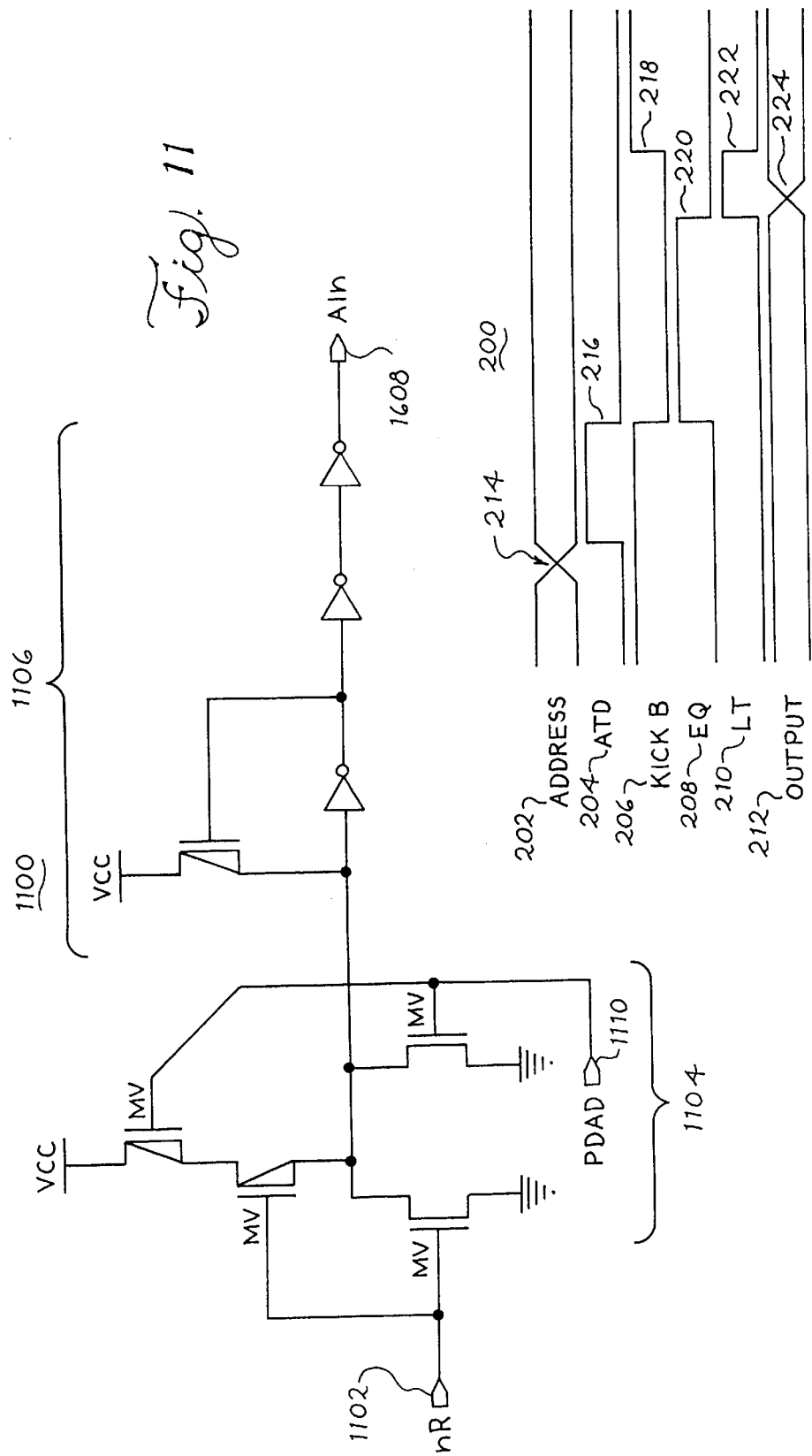
FIG. 2 depicts a timing diagram showing the relative timing of signals for read operations.

In one embodiment of the present invention, an address transition detector is provided which compensates for these timing inconsistencies. Referring now to FIG. 2, there is shown a timing diagram 200 for the signals associated with a read operation in the memory device 100. The diagram 200 shows the address bus signals ("address") 202 (these come from the address inputs 148), the address transition detect ("ATD") signal 204, the Kick ("KICKB") signal 206, the equalization ("EQ") signal 208, the latch ("LT") signal 210 and the data output bus ("output") 212 (which connects to the chip outputs 152). The address bus signals 202 come from some other device which is connected to the address inputs 148 of the flash memory device 100 such as a microprocessor or microcontroller. When the address bus signals 202 change or transition 214 to a new value, this transition 214 initiates the read timing sequence. As will be discussed below, it is the transition or change in particular input signals which preferably triggers certain events, such as the read operation sequence, on the flash memory device 100. It will be appreciated that such interface implementation details may vary from device to device and all such implementations are contemplated.

Once a transition 214 is detected in the address 202, an address transition detect ("ATD") pulse 216 is generated. This is discussed below in more detail. The ATD pulse 216 is then used to control the rest of the read path timing. In response to the ATD pulse 216, the Kick signal 206 is generated to boost the word lines of the memory arrays for a read. This is shown as an active low pulse 218. Further, in response to the ATD pulse 216, the EQ signal 208 rises to a high logic level 220 to equalize the differential sense amplifiers in the read circuits of the data latch 124 while the array data is being sensed. Once the data has been sensed from the array, the LT signal 210 generates a pulse 222 to trigger output latches in the data latch 124 to latch the read data for the output buffers 122. This causes the output 212 of the chip to change 224 to output the read data outside the device 100 over the outputs 152.

The duration of the ATD pulse 216 controls the access time for the read operation. The access time is the elapsed time from the moment an address is presented on the address inputs 148 to the time the read data appears on the outputs 152. Upon detection of an address transition 214, the ATD signal 204 goes from a low logic level to a high logic level. The ATD signal 204 then remains high for a specified duration, after which it returns to a low logic level. Upon this transition from a high logic level to a low logic level., the Kick signal 206 and the EQ signal 208 are triggered which initiates the read operation. Therefore, both initiation time and the duration of the ATD signal 204 are factors in the overall access time for the read operation.

In the flash memory device 100, other signals can also trigger an ATD signal 204 pulse and thereby commence the read operation sequence. For example. when the device is in the data polling mode, where an embedded erase or program operation is underway, the user of the device 100 can poll the device 100 to find out the status of the embedded operation. This status is placed on the data outputs 152 of the device 100. This is treated similarly to a read operation and requires an ATD pulse to initiate. An ATD pulse is also generated upon powering on the device 100, when the Chip Enable input 144 of the device is asserted low or when the device 100 is switched from word mode to byte mode or vice versa. It will be appreciated that the read operation sequence can be used by many different functions of the device 100 which need to produce data on the device outputs 152, all of which may require an ATD signal 204 pulse to initiate a read operation sequence.

It is preferred that the ATD signal 204 pulse width, and therefore the read access time, be the same no matter where the signal which triggers the ATD signal 204 pulse physically comes from on the integrated circuit which comprises the device 100. This simplifies the timing of the circuitry on the device 100 and results in the fastest overall access times to the device 100. Unfortunately, the different signals which can trigger the ATD signal 204 pulse come from locations on the device 100 which may or may not be close to the logic which generates the ATD signal 204 pulse. This means that different signals may cause different response times from this logic. Signals which are close to the ATD signal 204 pulse generator logic will reach the logic sooner and therefore will trigger the ATD signal 204 pulse faster than those signals which come from further distances away.

Figure 3:
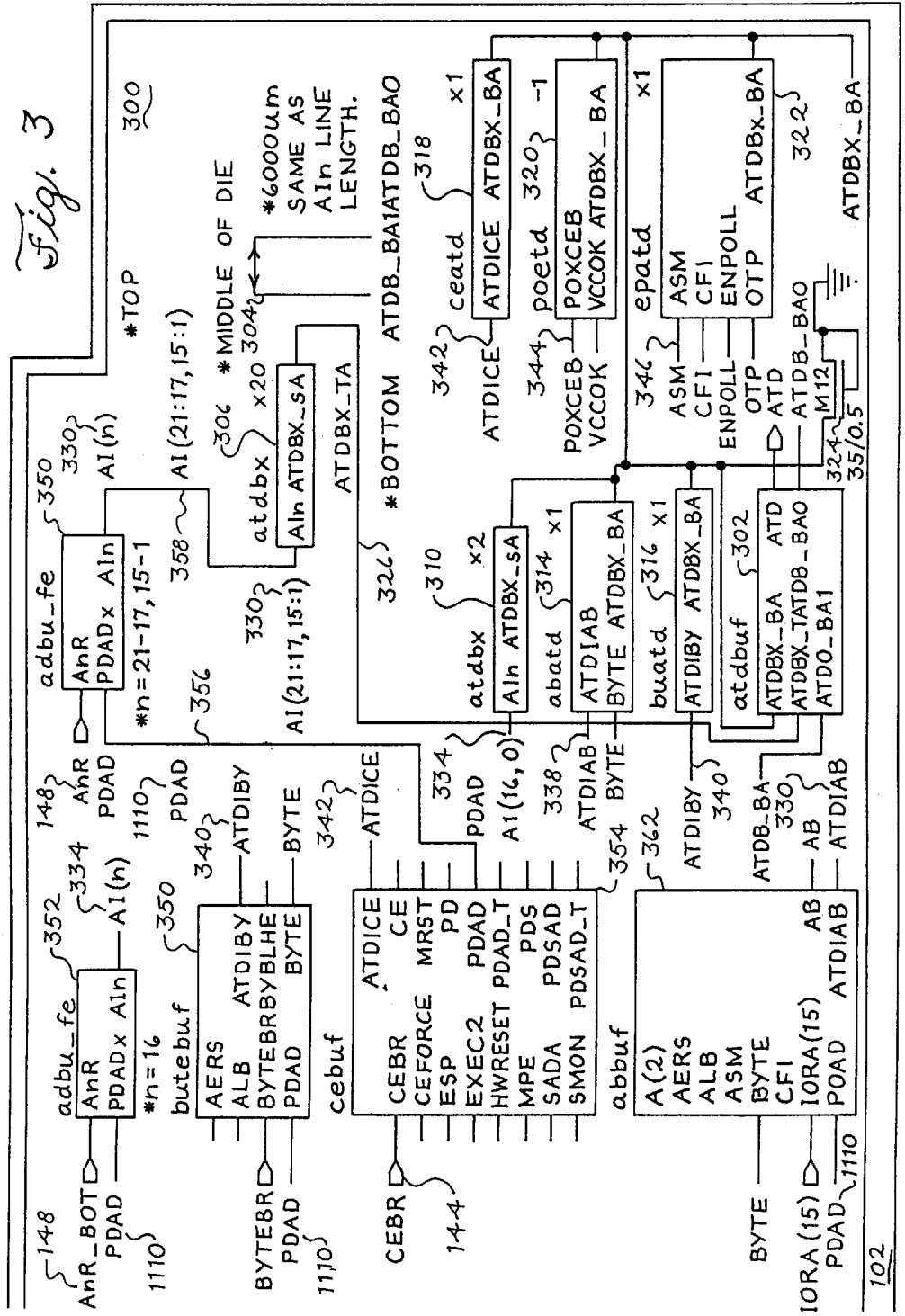
FIG. 3 depicts a schematic diagram of an address transition detect architecture according to a preferred embodiment.
Figure 4:
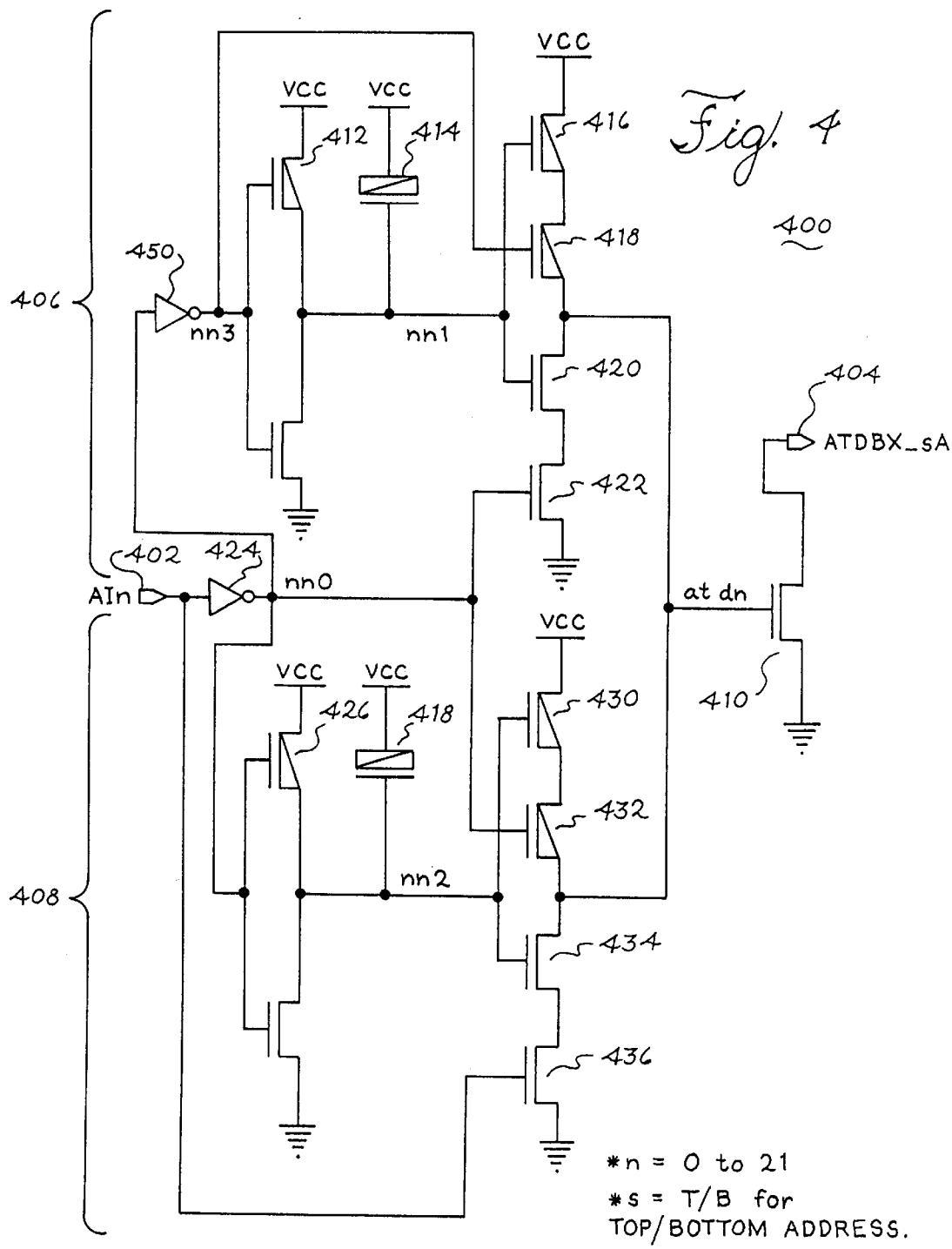
FIG. 4 depicts a schematic diagram of a preferred ATDBX circuit for use with the architecture of FIG. 3.

Referring to FIG. 3, there is shown a schematic diagram of a preferred state control and command register 102 of FIG. 1 including an Address Transition Detect ("ATD") signal generator circuit 300 with compensation for the unequal distances over which the trigger signals must travel. For the sake of clarity, a number of the components of the state control and command register 102 have been deleted in FIG. 3. The circuit 300 includes a pulse generator 302 (labeled "ATDBUF") and a bridge/path length equalization circuit 304. The circuit 300 further includes address input transition detectors 306, 310. The detectors 306,310 detect transitions in the input address bits and generate corresponding transition detect pulses as described below. Detector 306 is for address lines whose input connection pads are physically located at the top of the integrated circuit of the device 100 while detector 312 is for address lines whose input pads are physically located at the bottom of the integrated circuit. Detector 306 is actually a collection of twenty detector circuits (one of which is shown in FIG. 4 and described in more detail below), one for each indicated address line (21:17, 15:1), with the outputs connected together (in a wired-or configuration) and connected to an input of the signal generator 302 via a signal path 326 (labeled "ATDBX_TA"). Detector 310 is actually a collection of two detector circuits (shown in FIG. 4 and described in more detail below) with the outputs connected together (in a wired-or configuration) and connected to other detector circuits 314, 316, 318, 320, 322, as described below, and to a second input of the signal generator 302 via signal path 328 (labeled "ATDBX_BA").

The address lines which connect to the detectors 306, 310 come from address buffers 350, 352 (labeled "ADBU_FE") which are coupled with and buffer the address inputs 148 of the device 100. Referring to FIG. 11, there is shown an exemplary ADBU_FE circuit 1100 for use with the present embodiments. The circuit 1100 includes an input 1102 for an address input 148, a control circuit 1104 coupled with a power control signal 1110 (labeled "PDAD"), a buffer circuit 1106 and an output 1108 (labeled "AIn"). Under normal operation, the PDAD signal 1110 is unasserted which allows the ADBU_FE circuit 1100 to operate and buffer signals applied to the input 1102 to the output 1108. When the PDAD signal is asserted, the circuit 1100 is turned off. This occurs during various chip internal operations to prevent spurious signals from entering the device through the address inputs. There are twenty two ADBUd_FE circuits 1100 coupled with the address inputs, one for each address bit.

Referring back to FIG. 3, the PDAD signal 1110 is generated by the chip enable input 144 (labeled "CEBR") buffer circuit 354 (labeled "CEBUF"). As noted above, CEBR 144 is an active low signal which enables the output buffers 122 of the device. When CEBR 144 goes low, there is a time delay, known as Tce, from the time the signal is asserted to the time when the outputs 152 of the device 100 change to reflect the output data. When CEBR 144 Is asserted low, the CEBUF circuit 354 will deassert the PDAD signal 1110 which allows the address inputs 148 into the device 100. The CEBUF circuit 354 is physically located near the bottom of the integrated circuit. Therefore, the PDAD signal 1110 must travel along a relatively long signal path 356 to the ADBU_FE circuits 350 for address lines 21:17, 15:1 which are located at the top of the integrated circuit. The enabled address signals 330 must then travel back down another signal path 358 to the detectors 306. In contrast, the ADBU_FE circuits 352 for address lines 16 and 0 are located at the bottom of the integrated circuit, along with the control buffers 360, 362 for other input signals. The detectors 310, 314, 316 are also located at the bottom of the integrated circuit. Therefore, the PDAD signal 1110 and the enabled output signals 334, 340, 330 travel on relatively shorter signal paths between the buffer circuits 352, 360,362 and the detectors 310, ;14, 316. The additional signal path routing 356, 358 adds additional delay to the signal travel times. The delay is computed as a function of the resistance and capacitance of the signal paths 356, 358 and is referred to as the RC delay. For the purposes of this disclosure, each signal path 356, 358 has the equivalent of 1 unit of RC delay.

Due to the path length differential, the ADBU_FE circuits 352 at the bottom of the integrated circuit will activate before the ADBU_FE circuits 350 at the top of the integrated circuit with the result that any transitions in the address signals (16,0) 334 will reach the detectors 310 before the address signals (21:17, 15:1) 330 reach the detectors 306. The address signals 330, 334 are deasserted when the PDAD signal 1110 is asserted. When the PDAD signal 1110 is deasserted, depending on the input address, all or a subset of the address signals 330, 334 will assert. In one scenario, only address signals 334 for bits 16 or 0 are asserted. In an alternate scenario, only one or more address signals 330 for bits 21:17 and 15:1 are asserted. Further, while the PDAD signal 1110 is deasserted, one or more of the address inputs 148 may change while others remain in a steady state. In these transition scenarios, the respective signals may reach the corresponding address input transition detectors 306, 310 at different times resulting in different ATD pulses for the different addresses. The ATDBUF circuit 302 compensates for these timing anomalies as described below.

The ATD signal generator circuit 300 further includes a least significant bit ("LSB") address input transition detectors 314 (labeled "ABATE)"), a byte signal transition detector 316 (labeled "BYATD"), a chip enable input 103 transition detector 318 (labeled "CEATD"), a power input signal transition detector 320 (labeled "POATD"), a data polling read access signal transition detector 322 (labeled "EPATD") and a pulse signal loading equalization circuit 324. The outputs of these detectors 310, 314, 316, 318, 320, 322 and the pulse signal loading equalization circuit 324 are all connected together (in a wired-or configuration) and connected to an input of the signal generator 302 via a signal path 328 (labeled "ATDBX_BA").

Note that the address input transition detectors 306, 310 all utilize the same circuit design which is depicted in FIG. 4 and labeled "ATDBX". The detectors 306 includes inputs 330 for 17 address bits, 21:17 and 15:1, therefore there are 20 ATDBX circuits 400 used, one for each input and all have their outputs connected together and to the ATDBX_TA signal path 326. Detector 310 has inputs 334 for address bits 16 and 0 and therefore there are two ATDBX circuits 400 used with their outputs connected together.

Referring now to FIG. 4, there is shown an ATDBX circuit 400 for use in the detectors 306, 310. This circuit 400 includes an input 402 (labeled "AIn"). This circuit 400 is used 22 times, once for each address input. The ATDBX circuit 400 further includes an output 404 (labeled "ATDBX_sA") which connects with either the ATDBX_TA signal path 326 or the ATDBX_BA signal path 328. This circuit is designed to pull output 404 to a low logic level for pre-set duration of time when a transition is detected on the input 402 and then return the output 404 to float state to be pulled up to a high logic level by the signal generator 302 (discussed in more detail below). A transition is defined as the input signal changing from a high logic level (1) to a low logic level (0) or from a low logic level (0) to a high logic level (1).

The ATDBX circuit 400 includes a high to low transition circuit 406, a low to high transition circuit 408 and a pull down transistor 410. Pull down transistor 410 is preferably an n-channel transistor. When either transition circuit 406, 408 detects a signal transition on the input 402, transistor 410 will be turned on which will ground ATDBX_sA 404, pulling it down to a low logic level. The gate input to the pull down transistor 410 is labeled "atdn". The high to low transition circuit 406 includes an inverter 412, a pull-up delay capacitor 414, p-channel control transistors 416, 418 and n-channel control transistors 420, 422. Inverter 412 and transistor 418 are connected to the input AIn 402 (via two complementary inverters 424 and 450) and transistors 416 and 420 are connected to the output of the inverter 412 and the pull up delay capacitor 414.

The low to high transition circuit 408 includes inverters 424, 426, pull up delay capacitor 428, p-channel control transistors 430, 432 and n-channel control transistors 434, 436. Inverter 424 and transistor 436 are connected to the input AIn, inverter 426 and transistors 422 and 432 are connected to the output of the inverter 424 and transistors 430 and 434 are connected to the output of the inverter 426 and the pull up delay capacitor 428.

When the input 402, Ain, is in a steady state high (1) logic level, transistors 416, 432, 434 and 436 will be on and transistors 418 and 430 will be off. This effectively grounds the gate, atdn, of the pull down transistor 410, keeping it turned off. When the input 402, Ain, is in a steady state low (0) logic level, transistors 418, 420, 422 and 430 are on and transistors 416, 432, 434 and 436 are off. Again, this effectively grounds the gate, atdn, of the pull down transistor 410, keeping it turned off. When the input 402, AIn transitions from a high logic level (1) to a low logic level (0), transistor 418 will immediately turn on and transistor 436 immediately turns off. Transistor 416 remains on. This happens because the rise time of the output of the inverter 412 is delayed by the pull up delay capacitor 414. This delay is caused by the added capacitance. The pull up delay capacitor 414 is preferably fabricated from a p-mos transistor whose capacitance is a direct function of the channel area. The channel area is given by the length and width of the channel as specified in the Figure. A larger area will impart a longer delay. Calculations of delay imparted on a signal by a capacitor are well known in the art. In the memory device 100, the preferred channel length to width ratio for the p-channel pull up delay capacitor is 5/2 microns.

After the delay and the output of the inverter 412 reaches a logic high level, transistor 416 will turn off. While transistors 416 and 418 are on, the gate, atdn, of the pull down transistor 410 is connected to Vcc which turns on the pull down transistor 410 and grounds the output 404. Once the output of the inverter 412 reaches a high logic level, transistor 416 will turn off and transistor 420 will turn on. This will ground the gate, atdn, of the pull down transistor 410, turning it off and returning its output to a floating state.

For transitions on the input 402 from a low logic level (0) to a high logic level (1), a similar process occurs in the low to high transition circuit 408. In this way, any transition on the input 402 will cause the output 404 to be temporarily pulled down to ground.

Figure 5:
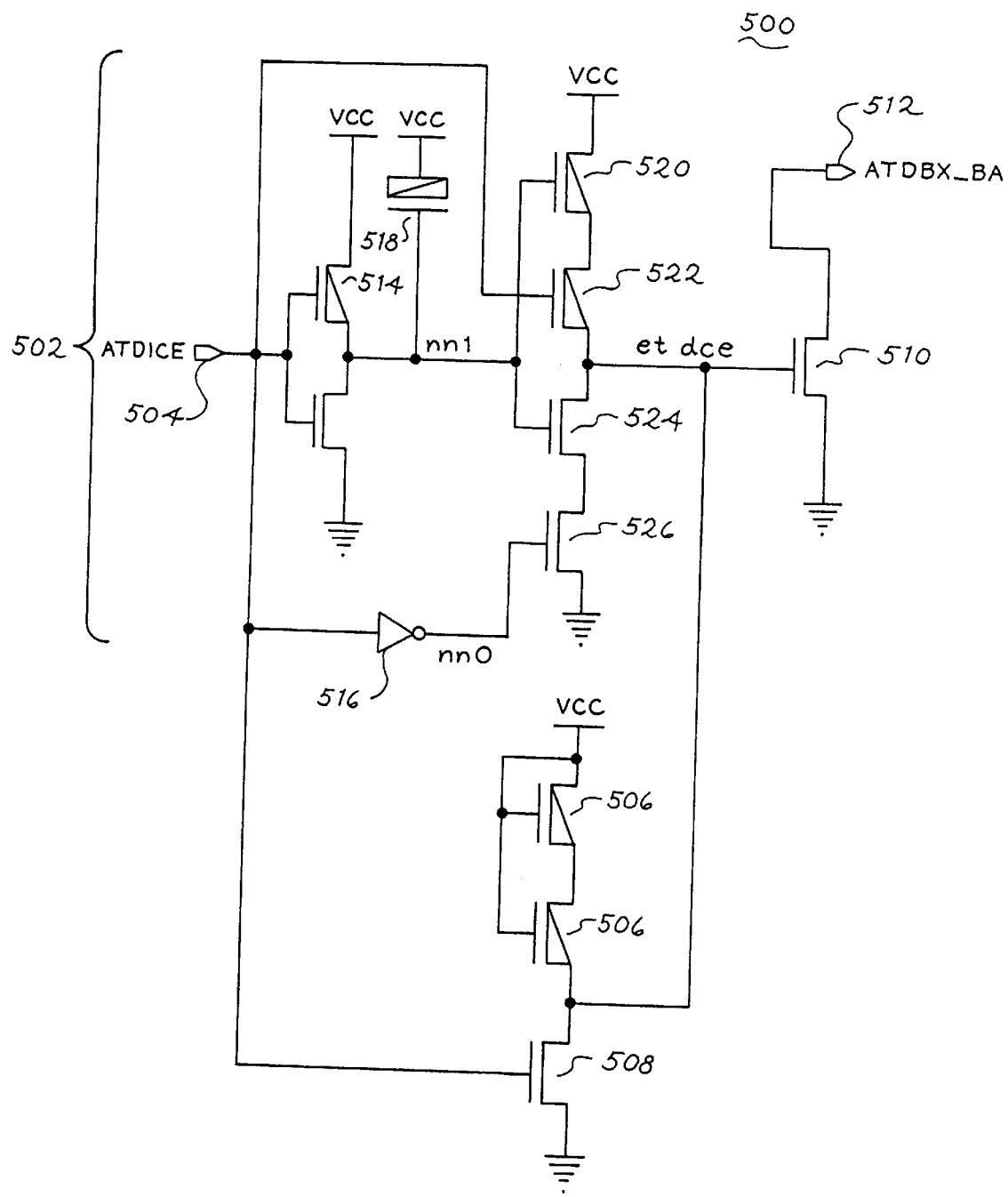
FIG. 5 depicts a schematic diagram of a preferred CEATD circuit for use with the architecture of FIG. 3.

Referring now to FIG. 5, there is shown a schematic diagram of the circuit 500 used in the chip enable input transition pulse generator, CEATD 318. This circuit 500 is used to detect transitions of the chip enable input 144 (labeled "CE#" in FIG. 1). The chip enable input 103 to the device 100 is an active low signal which means that only a transition from a high logic level (1) to a low logic level (0) is significant. This pulse generator 318 is therefore designed to only detect this transition. The circuit 500 is similar to the ATDBX circuit of FIG. 4 except that it only has a high to low transition circuit 502. The circuit 500 further includes an input 504 (labeled "ATDICE"), p-channel control transistors 506, n-channel control transistor 508 and pull down transistor 510. Pull down transistor 510 is an n-channel transistor with a gate input labeled "atdce", a source input connected to ground and a drain output 512 connected to the ATDBX_BA signal path 328. The high to low transition circuit 502 includes inverters 514 and 516, pull up delay capacitor 518, p-channel control transistors 520, 522 and n-channel control transistors 524, 526. Whenever the input 504 transitions from a 1 to a 0, the transistor 508 will turn off and the high to low transition circuit 502 will temporarily connect the gate input, atdce, of the pull down transistor 510 to Vcc, effectively grounding the output 512. Transistor 520 will remain on and transistor 524 will remain off until the output of the inverter 514 reaches a high logic level turning transistor 520 off and transistor 524 on. In all other situations, transistor 508 will stay on, grounding the gate input, atdce, of the pull down transistor 510, keeping it turned off. In this way, only chip enable 144 transitions from a high logic level to a low logic level will pull the output 512 low.

Figure 6:
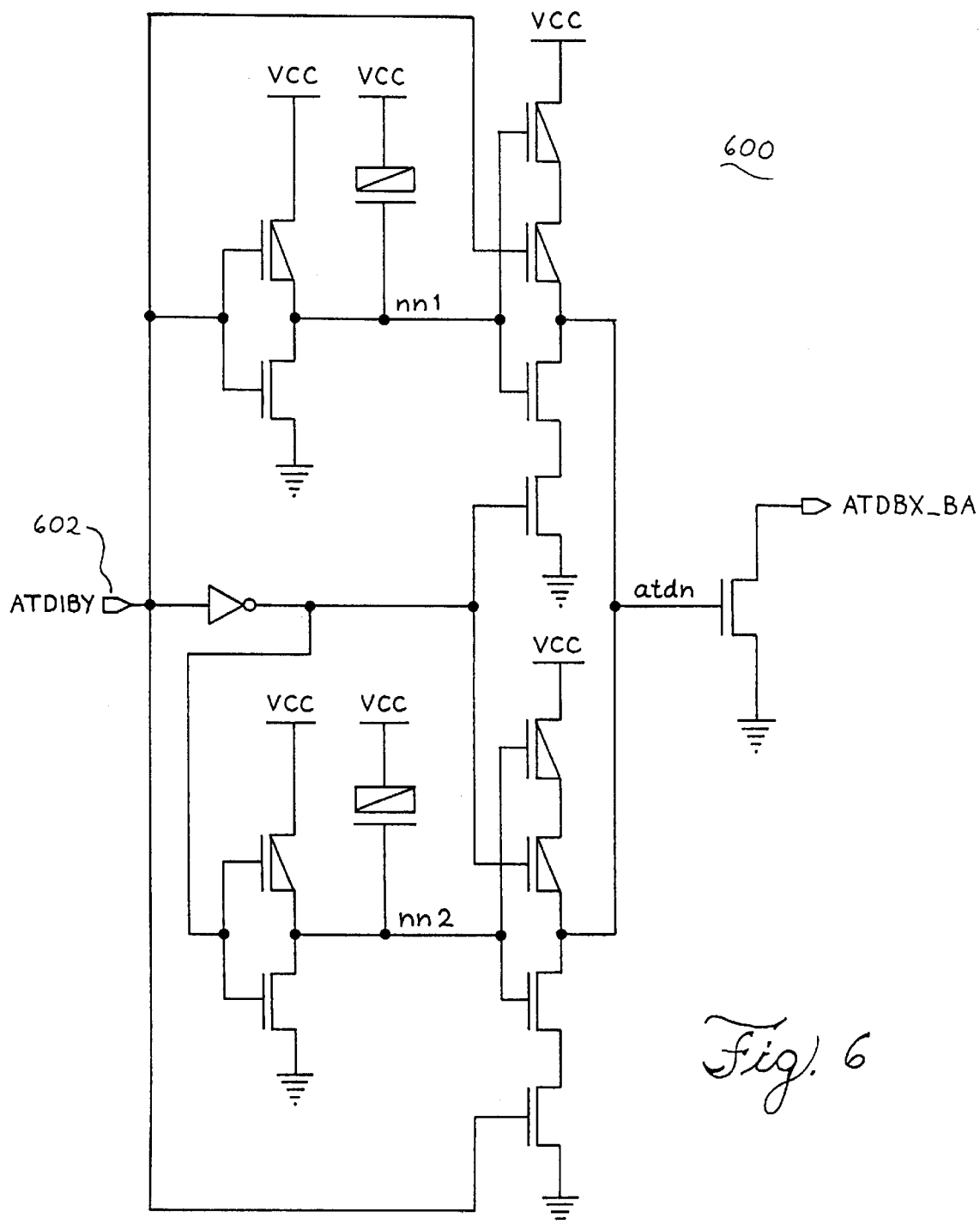
FIG. 6 depicts a schematic diagram of a preferred BYATD circuit for use with the architecture of FIG. 3.

Referring now to FIGS. 6–9, there are shown schematic diagrams for the POATD 320 (FIG. 9), the EPATD 322 (FIG. 8), the ABATD 314 (FIG. 7) and the BYATD 316 (FIG. 6) detectors. Referring to FIG. 6, the BYATD 312 has the same circuit design as the ATDBX circuit, except for the complementary inverters 424 and 450 on the input to the high to low transition circuit 406. The BYATD 312 has an input 602 (labeled "ATDIBY") connected to the logic which determines the addressing mode of the device 100 (this logic is not shown). This logic tells the device 100 to operate in byte or word mode where the user can read data out of the device 100 and program the device 100 byte by byte or word by word (where a word is 2 bytes). When this signal 602 is unasserted, the device 100 is operating in word mode where data can only be read out or programmed one word at a time. One word is equal to two bytes. When the user desires to switch from byte mode to word mode or vice versa, the BYATD 312 will detect the transition in the signal 602 and pull the ATDBX_BA signal path 328 low.

Figure 7:
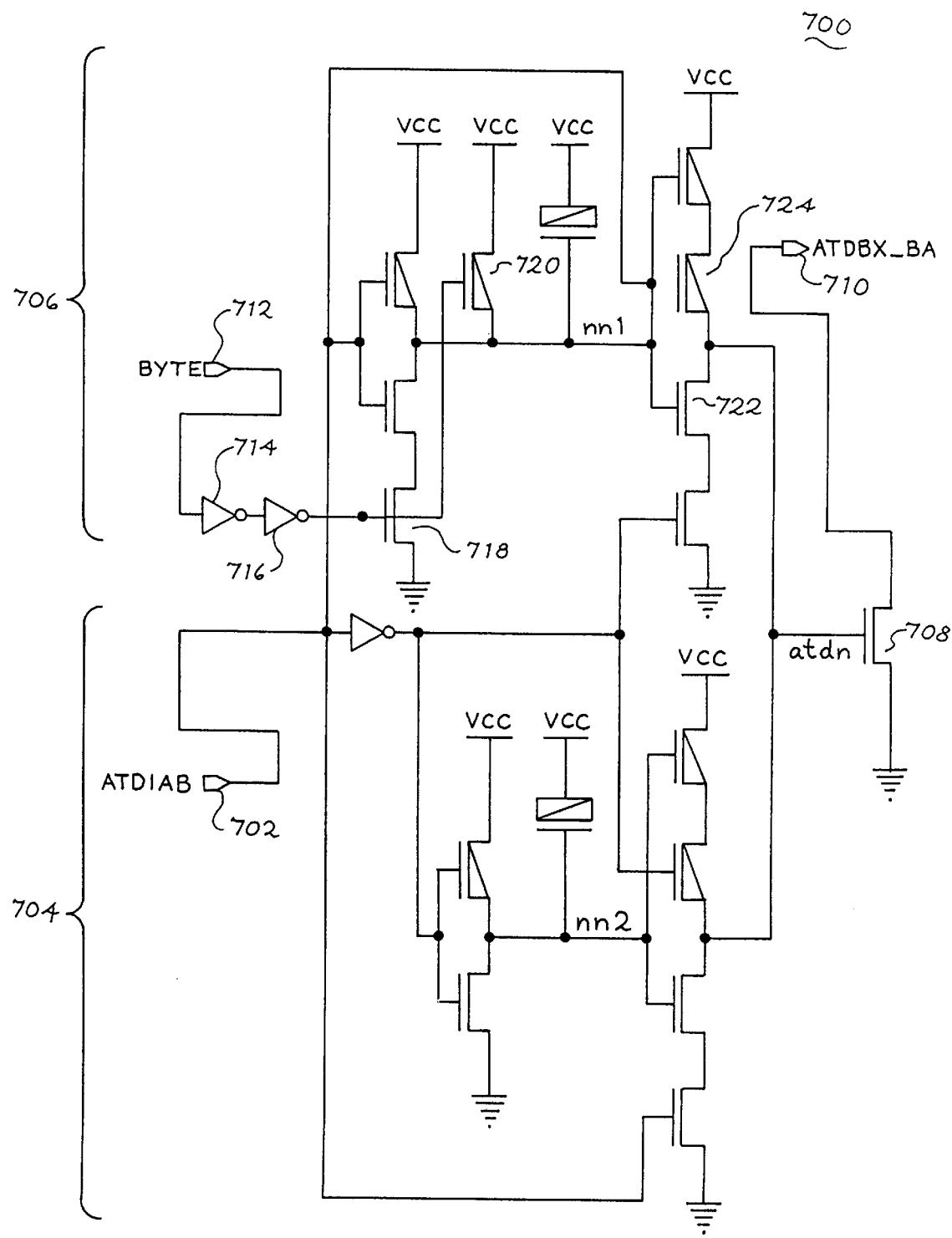
FIG. 7 depicts a schematic diagram of a preferred ABATD circuit for use with the architecture of FIG. 3.

The exemplary flash memory device 100 provides 22 dedicated address bit inputs 102. The device 100 has a capacity of 64 megabits which is equivalent to 8 megabytes ($2^{23}$ bytes) or 4 mega-words (222 words) (1 word=2 bytes). The 22 bit address width allows 222 combinations which is enough to address 4 mega-words, however to address 4 megabytes, 23 address bits are needed. When the device 100 is in BYTE mode, the $16^{th}$ bit of the data output 192 (also known as "DQ15") is switched from an output to become an address input for the least significant bit ("LSB") of the 23 bit byte address. Referring now to FIG. 7, there is shown a ABATD circuit 700 used in the detector 314 for detecting a signal transition on this $23^{rd}$ address input. This circuit 700 operates similarly to the ATDBX circuit 400 (FIG. 4). This circuit includes an input 702 (labeled "ATDIAB") which connects to the LSB input of the device 100, low to high transition circuit 704, a high to low transition circuit 706, pull down transistor 708 and an output 710 (labeled "ATDBX_BA") connected to the ATDBX_BA signal path 328. This circuit 700 further includes an input 712 which is labeled "BYTE". This input 712 is necessary in case the chip enable input 103 to the device 100 transitions from high to low at the same time the BYTE mode input transitions. In this case, the CEATD detector 318, the BYATD detector 316 and the ABATD detector 314 would be activated one after the other resulting in an extended ATD pulse. To prevent this, the BYTE signal is used to kill the ATD pulse generated when the ATDIAB input 702 transitions from high to low. The BYTE input 712 is an active low signal which connects to additional logic in the high to low transition circuit 706. This additional logic includes inverters 714 and 716, n-channel transistor 718 and p-channel transistor 720.

When the BYTE input 712 is a 1, the two inverters 714 and 716, connected in series with the input 712 simply strengthen the signal. Transistor 718 will be on and transistor 720 will be off. Effectively, then this circuit will operate exactly like the ATDBX circuit 400, detecting both transitions from 0 to 1 and from 1 to 0 (FIG. 4 and described in detail above). If the BYTE input 712 is a 0, then transistor 718 will be off and transistor 720 will be on. This will force on n-channel transistor 722 and force off p-channel transistor 724. When a transition on the input 702 is made from 1 to 0, the high to low transition circuit 706 is prevented from turning on transistor 724 and connecting the gate input, atdn, of the pull down transistor 708 to Vcc and turning it on. This effectively prevents the ABATD circuit 310 from generating an ATD pulse during high to low transitions. However, if the input 702 transitions from 0 to 1, then the low to high transition circuit 704 is able to pull the output 710 to ground to generate the ATD pulse.

Figure 8:
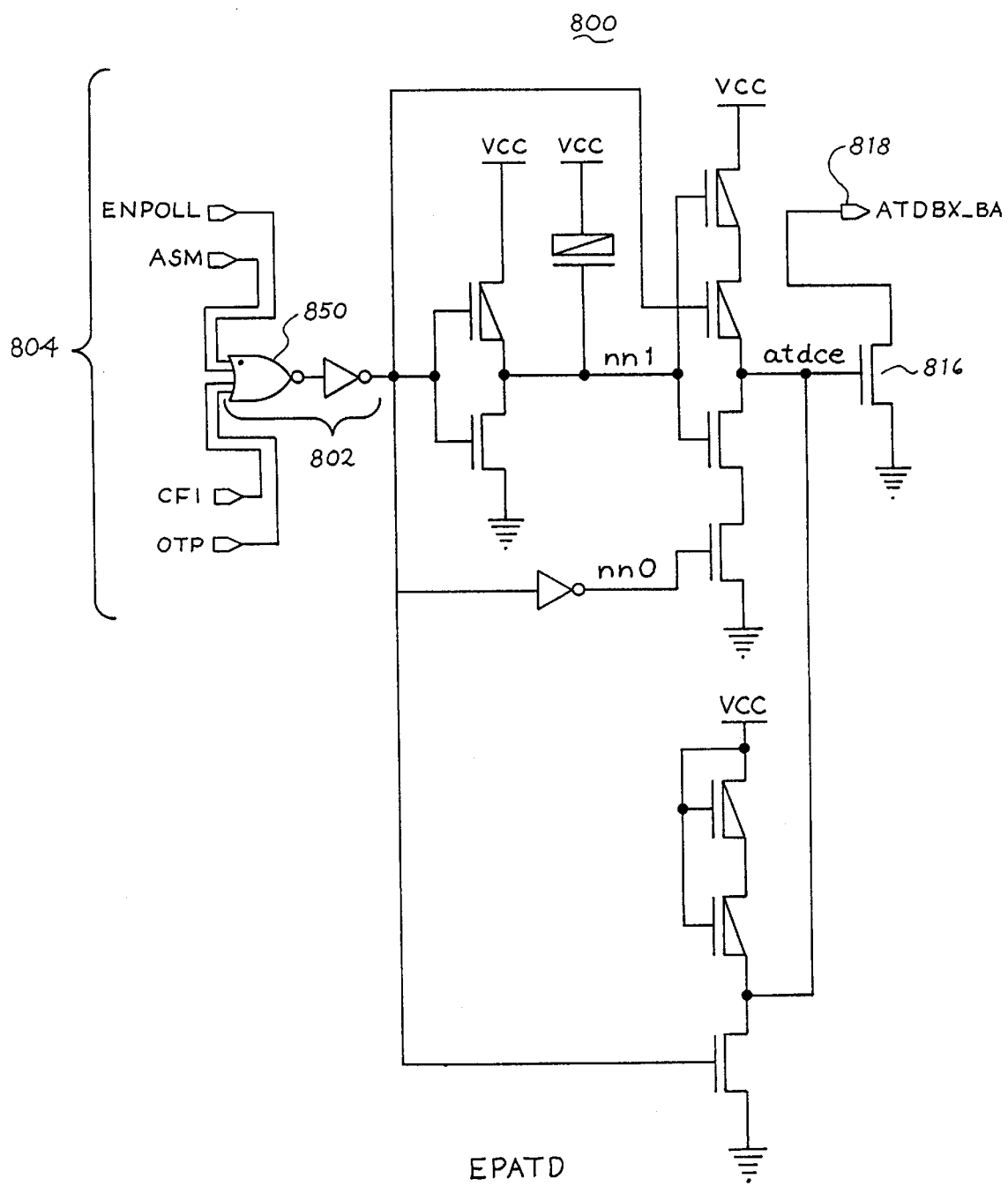
FIG. 8 depicts a schematic diagram of a preferred EPATD circuit for use with the architecture of FIG. 3.

Referring now to FIG. 8, there is shown a schematic diagram of the EPATD circuit 800 of the data polling read access signal transition detector 306. The EPATD circuit 800 is designed to detect when the device 100 is undergoing a data polling read access, indicated by the ENPOLL signal which will be at a high logic level when the an embedded operation is underway. ENPOLL will drop to a low logic level if the user tries to perform a read operation. During the data polling access mode of the device 100, while an embedded operation (program or erase) is taking place, the user can provide the address of the data being programmed or erased and monitor the $7^{th}$ data output pin of the device 100 for status. If an embedded erase in progress, the output pin will show a 0 and when the erase completes, it will show a 1. During an embedded program, the output pin will show the complement of the datum being programmed and once programming is complete, it will show the actual value programmed. Therefore an ENPOLL high to low transition must trigger a read operation sequence to load valid data from the array into the read sense amplifier output latches upon completion of the embedded operation. Note that if a read operation sequence has already been initiated and the ENPOLL signal transitions from 1 to 0, this circuit will not generate another ATD pulse. This circuit 800 also responds to high to low transitions of the ASM signal which indicates auto select mode, the CFI signal which indicates the user is attempting read data from the common flash interface, and OTP signal which indicates the user is trying to read data from the One Time Programmable sector. All of the input signals are connected to NOR gate 850.

The EPATD circuit 800 includes input logic 802 for the input signals. Logic 802 connects to a high to low transition detector 804 which is connected to the gate (labeled "atdce") of the n-channel pull down transistor 816. The output of the pull down transistor 816 is connected to the output 818 which connects to the ATDBX_BA signal path 328.

Figure 9:
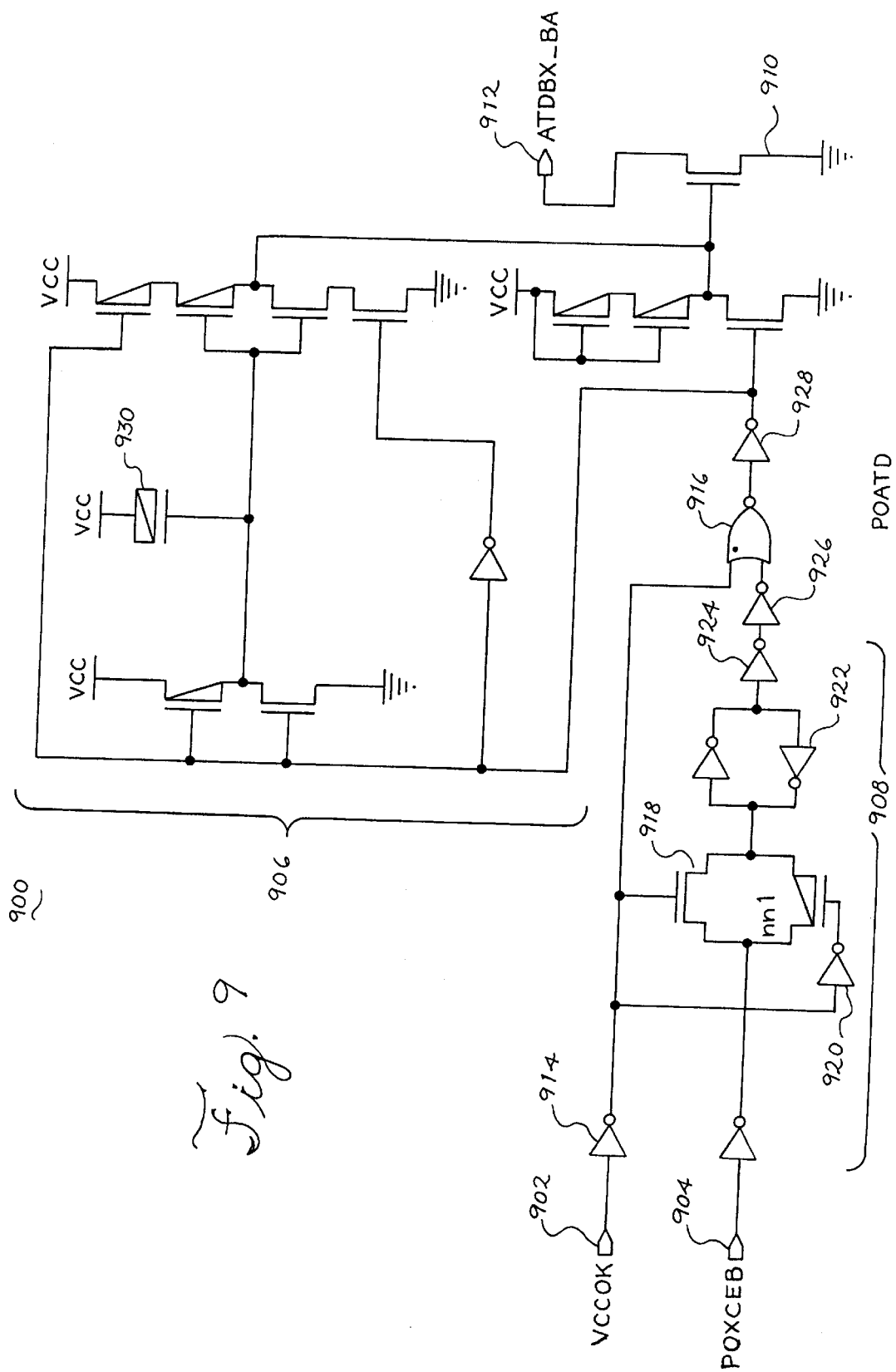
FIG. 9 depicts a schematic diagram of a preferred POATD circuit for use with the architecture of FIG. 3.

Referring now to FIG. 9, there is shown a schematic diagram of a POATD circuit 900 for a power input signal transition detector 320. The circuit 900 includes an input 902 for a power on signal, labeled "VCCOK", and an input 904 for a power on test mode indicator, labeled "POXCEB". The circuit 900 further includes a detector circuit 906, a latch circuit 908, an n-channel pull down transistor 910 and an output 912 connected to the ATDBX_BA signal path 328. This circuit 900 is designed to detect power on of the device 100 and cause a read path operation sequence to begin so that the user does not have to transition the address inputs 148 of the device to read the first address. With this scheme, the device will read out the data of the address on the inputs 148 as of power on. However, if the power on signal comes during the column pre-test mode of the device 100, an ATD pulse should not be generated.

The input 902 VCCOK is the power on signal which will transition from 0 to 1 upon power on. This signal is inverted by inverter 914 and then connected to NOR gate 916. The latch circuit 908 includes inverter 920, transmission gate 918, latch 922 and series inverters 924 and 926. The input 902 is also connected to the transmission gate 918. A transmission gate or pass gate is built from back to back n-channel and p-channel transistors. The n-channel transistor is connected to a control signal and the p-channel transistor is connected to the inverted control signal. When the control signal is asserted, the transmission gate will pass its input to the output. This device takes advantage of the fact that n-channel transistors pass good high logic values but not good low logic values and p-channel transistors pass good low logic values but not good high logic values. In the circuit 900, the control signal for the transmission gate is the output of the inverter 914. The input of the transmission gate 918 is the POXCEB input 904 which indicates when the device 100 is in column pretest mode. The output of the transmission gate connects to the latch 922. The latch 922 output is connected to the first inverter 924 which connects to the second inverter 926 and then to the second input of the NOR gate 916.

The output of the NOR gate 916 connects to an inverter 928 and then to the detector circuit 906. The detector circuit 906 will turn on the pull down transistor 910 for a short duration of time when the output of the NOR gate 916 changes from 0 to 1. The detector circuit 906 is similar to the CEATD circuit 500 (FIG. 5), described in more detail above. However, in the detector circuit 906, the pull up delay capacitor 930 has a larger area as determined by its channel length and width which results in a longer rise time and ultimately a longer ATD pulse. In the preferred POATD circuit 900, the pull up delay capacitor 930 has a channel length to width ration of 7/8 although other values may work as well.

If the device 100 is not in a pre-test state, the POXCEB input 904 will be 0. If the VCCOK input is 0, then the transmission gate 918 will pass the output of inverter 920 to the latch 922 which will in turn pass the signal to the inverters 924 and 926 putting a 0 on the input to the NOR gate 916. When the VCCOK signal changes from 0 to 1, the transmission gate 918 will turn off, causing the latch 922 to latch the 0 value of the POXCEB input 904 input and hold a 0 value on the input of the NOR gate 916 even if the POXCEB input 904 subsequently changes. The transition from 0 to 1 of the VCCOK input will cause the other input of the NOR gate 916 (which is connected to inverter 914) to transition from 1 to 0. This will cause the output of the NOR gate 916 to switch from 0 to 1 which causes the output of the inverter 928 to switch from 1 to 0 triggering the detector circuit 906 to turn on pull down transistor 910.

If the device 100 is in a pre-test state, the POXCEB input 904 will be 1. This 1 will be passed by the latch circuit 908 to the input of the NOR gate 916. If the VCCOK signal then transitions from 0 to 1, the transmission gate 918 will turn off, causing the latch to hold the 1 value of the POXCEB input 904 on the input of the NOR gate 916 which will prevent it from switching and causing the detector circuit 906 to turn on the pull down transistor 910. Therefore, even if the POXCEB input 904 subsequently drops to 0, an ATD pulse will not be generated.

Referring back to FIG. 3, there is shown a schematic diagram of a preferred pulse signal loading equalization circuit 324. As was described above, the outputs of the detectors 306 and 308 are all connected in a wired-or configuration to the ATDBX_TA signal path 326. In reality, it is the outputs of the pull down transistors of each circuit which are connected. For the ATDBX_TA signal path 326, there are 20 pull down transistors. The outputs of the detectors 310, 314, 316, 318, 320 and 322 are all similarly connected in a wired-or configuration to the ATDBX_BA signal path 328. However, these circuits only include 8 pull down transistors (including another CEATD circuit 500 which is part of the feedback delay circuit 1026 of the atdbuf circuit 1000 shown in FIG. 10 and described in more detail below). This results in unequal loading of the ATDBX_TA signal path 326 with 20 pull down transistors and the ATDBX_BA signal path 328 with only 8 pull down transistors. This unequal loading will affect the ATD pulse signal timing because, as will be discussed below, these signal paths 326, 328 initiate the ATD pulse. Therefore, the pulse signal loading equalization circuit 324 is used to connect to the ATDBX_BA signal path 328 and equalize the loading. The pulse signal loading equalization circuit 316 includes the equivalent of 12 pull down transistors. The circuit 324 includes an n-mos transistors connected in series with the ATDBX_BA signal path 328. The large channel width to length ratio makes this transistor appear as 12 turned off pull down transistors to the overall circuit. In the memory device 100, the preferred transistor channel length to width ratio is 35/0.5 microns however, circuit configurations which match the pull down loading of the ATDBX_TA 326 and ATDBX_BA 328 signal paths are contemplated.

In addition to equalizing the loading of the signal paths 326, 328, the parasitic capacitance and the resistance of the paths must also be matched. The delay imparted on the pulse signals traveling over the signal paths 356, 358 and 326, 328 is directly related their resistance and capacitance which is a function of their path length and width. As was discussed above, it is desirable that the delays in both signal paths 356, 358, 326, 328 be substantially equal so that signal transitions happening at the top and/or bottom of the chip trigger the ATD signal generator 300 at the same time and result in an ATD pulse of the same duration. As can be seen, if inputs coming from the top of the integrated circuit and inputs from the bottom of the integrated circuit transition at the same time the pulses generated by their detectors will arrive at the signal generator at different times, potentially causing a longer than necessary ATD pulse. The bridge circuit 304 equalizes the resistance/capacitance delay in the path lengths. As will be discussed below, the atdbuf circuit 1000 (shown in FIG. 10 and discussed in more detail below) receives the ATDBX_BA signal 328 from the detectors 310, 314, 316, 318, 320, 322 located at the bottom of the chip and ATDX_TA signal 326 from the detectors 306 located at the top of the chip.

In order to equalize the RC delay of the signal paths 35, 358 for the PDAD signal 1110 and the address signals 330 from the top to the bottom of the integrated circuit, the bridge circuit 304 is provided. The bridge circuit 304 is a signal path adjusted to equalize ATDBX_BA signal path 328 with the ATDBX_TA signal path 326 to account for the inequities in the signal paths of the inputs to the detectors 306, 310, 314, 316, 318, 320, 322. As described below, the atdbuf circuit 302 further includes a delay circuit 1026 coupled with the bridge circuit 304 to effect the equalization.

Figure 10:
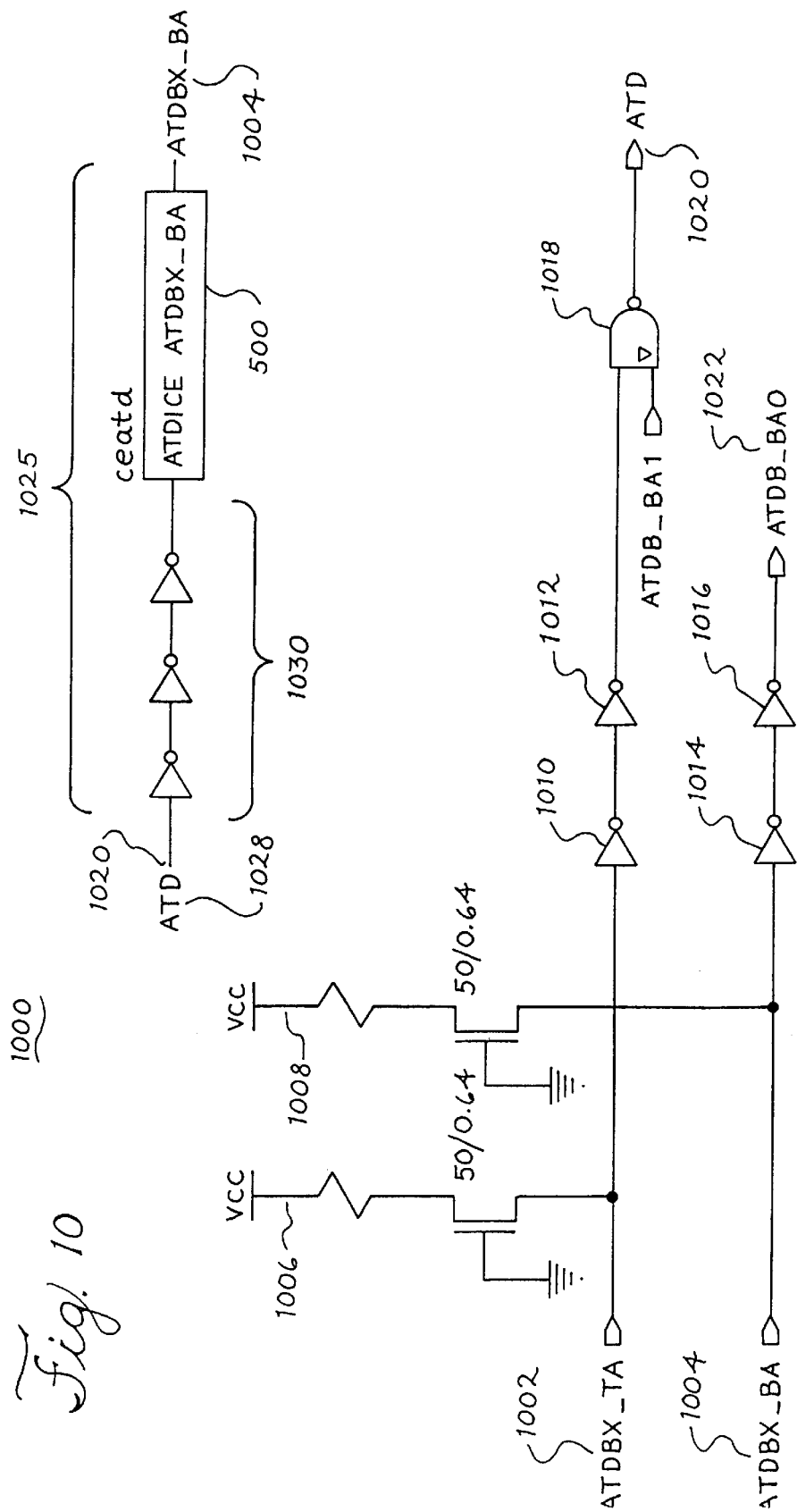
FIG. 10 depicts a schematic diagram of a preferred ATDBUF circuit for use with the architecture of FIG. 3.

Referring now to FIG. 10, there is shown a preferred ATDBUF circuit 1000 for use in the address transition pulse generator 302. The circuit 1000 includes an input 1002, labeled ATDBX_BA, which connects to the ATDBX_BA signal path 328 which connects to transition detectors 310, 314, 316, 318, 320, 322 and the pulse signal loading equalization circuit 324, for signals originating at the bottom of the integrated circuit. The circuit 1000 also includes an input 1004, labeled ATDBX_TA, which connects to the ATDBX_TA signal path 326 which connects to transition detectors 306 for signals originating at the top of the integrated circuit. The circuit 1000 further includes two pull up networks 1006 and 1008, inverters 1010, 1012, 1014 and 1016, NAND gate 1018 and output 1020 for the generated ATD signal. In addition, circuit 1000 includes a feed back delay circuit 1026. The input 1002 receives the transition detection signals from the transition detectors 310, 314, 316, 318, 320 and 3222 via the ATDBX_BA signal path 328 and the input 1004 receives the transition detection signals from the transition detectors 306 via the ATDBX_TA signal path 326.

One pull up network 1006 is connected to the input 1002 and pulls the ATDBX_TA signal path 326 high after it has been pulled low by the pull down transistors in the transition detectors 306. The other pull up network 1008 is connected to the input 1004 and pulls the ATDBX_BA signal path 328 high after it has been pulled low by the pull down transistors in the transition detectors 310, 314, 316, 318, 320, 322. As described above, the transition detectors 306, 310, 314, 316, 318, 320, 322 will turn on their pull down transistors when they detect their particular signal transition. The pull down transistor will then connect the ATDBX_TA 326 or the ATDBX_BA 328 signal paths to ground as the case may be. This will pull the signal path low. When the transition detector turns off the pull down transistor (as described above), the signal paths 326 and 328 will be left to float and the diode/resistive pull up networks 1006, 1008 will pull their respective signal paths back to a high logic level. The networks 1006, 1008 include a network of diodes and resistors as well as a p-channel transistor to provide a delayed signal pull up. In the preferred embodiments, the p-channel transistor has a length to width ratio of 50/0.64.

The input 1002 for the ATDBX_TA signal path 326 connects to the pull up network 1006 and then to inverters 1010 and 1012, which boost the signal strength, and then to the NAND gate 1018 whose output 1020 is the address transition detect signal. The input 1004 for the ATDBX_BA signal path 328 connects to the pull up network 1008 and then to inverters 1014 and 1016, which boost the signal strength, and then to output 1022, labeled ATDB_BA 0. Output 1022 is connected to the bridge circuit 304 (see FIG. 3). The bridge circuit 304 connects back to the input 1024, labeled ATDB_BA1, which is connected to the other input of the NAND gate 1018.

The feedback delay circuit has an input 1028 for the ATD signal 1020. This input is passed through three inverters 1030 connected in series and then connected to a CEATD circuit 500. The output of the CEATD circuit 500 is connected to the ATDBX_BA input 1004. A CEATD circuit 500 is used here as a delay element which extends the duration of the ATD pulse. The CEATD circuit 500 detects when the pulse is initiated (goes from unasserted to asserted) and pulls its output low. As described below, this sets up a feedback through the atdbuf circuit 1000 and the bridge circuit 304 to extend the duration of the ATD pulse and equalize the RC delays imparted in the signals by the signal paths 356, 358. While the ATD pulse is active high, the three inverters 1030 convert the signal to an active low signal so that the same CEATD circuit 500 can be used for both the chip enable input transition detector 318 and the feedback delay circuit 1026 without modification (See above, and FIG. 5).

When a signal transition occurs on one of the signal inputs to the ATD signal generator 300, one of the transition detectors will connect their pull down transistor to ground pulling down either the ATDBX_TA signal path 326 or the ATDBX_BA signal path 328. Effectively, putting zero on one of the inputs 1002, 1004 of the signal generator 302. After a short duration, the pull down transistor will turn off and the signal path 326 or 328 will float. At this point, the corresponding pull up network 1006, 1008 will pull the signal high again.

The input 1002 for the ATDBX_BA signal path 328 is passed through the ATDBUF circuit 1000 and out to the bridge circuit 304 via the output 1022. The bridge circuit 304 passes the signal along a length of signal path which equalizes the overall signal path length of the ATDBX_BA signal path 328 to the combination of the PDAD 356 or AI (21:17, 15:1) 358 signal paths and the ATDBX_TA signal path 326. The bridge circuit 304 then passes the signal back into the ATDBUF circuit 1000. Both the ATDBX_TA 326 and ATDBX_BA 328 signal paths ultimately connect to the NAND gate 1018 which asserts the ATD signal pulse whenever one of the inputs is low (0). The ATD signal output 1020 is connected to the feedback delay circuit 1026. When the ATD signal transitions from low to high, the CEATD circuit 500 will trigger and pull the ATDBX_BA input 1004 low. This will feed back to the atdbuf circuit 1000 and extend the duration of the ATD pulse. The CEATD circuit 500 only responds to signal transitions from high to low therefore only one feedback of the ATD signal will occur for a give input signal transition.

The circuit operates as follows. When an address signal 148 originating from the top of the integrated circuit transitions, the signal from the buffer 350 must travel down the AI (21:17, 15:1) signal path 358 incurring 1 RC delay. The transition will cause the detector 306 to pull the ATDBX_TA signal path 326 low generating an ATD pulse. The ATD pulse will feed back through the feedback delay circuit 1026 which will pull down the ATDBX_BA signal path 328. The ATDBX_BA signal path 328 is passed through the bridge circuit incurring 1 RC delay. The RC delay of the ATDBX_BA signal path 328 is therefore equivalent to the RC delay of the ATDBX_TA signal path 326 and equal to 1 RC delay. Therefore, the inputs which initiate the ATD pulse are subjected to a total of 2 RC delays.

When an address signal 148 or other input originating from the bottom of the integrated circuit transitions, the signal from the buffer 352 causes the detector 310 to pull the ATDBX_BA signal path low. The ATDBX_BA. signal path is passed over the bridge circuit 304, incurring a delay of 1 RC, and subsequently generating an ATD pulse. The ATD pulse triggers the feedback delay circuit 1026 which again pulls the ATDBX_BA signal path 326 low, passing through the bridge circuit 304 and incurring an additional RC delay. Therefore, the inputs which initiate the ATD pulse are subjected to a total of 2 RC delays.

When the chip enable input 144 transitions, the chip enable input buffer 354 generates the ATDICE signal 342 to the chip enable transition detector 318 and also deasserts the PDAD signal 1110. The PDAD signal 1110 travels to the top of the integrated circuit via PDAD signal path 356 to the ADBU_FE circuits 350 incurring 1 RC delay. This causes the ADBU_FE circuits 350 to activate and pass the address inputs 148 to the AI (21:17, 15:1) signal path 358. The address signals travel to the address transition detectors 306 incurring an additional RC delay. In addition, the ATDICE signal 342 causes the chip enable transition detector 318 to pull the ATDBX_BA signal path 328 low, incurring 1 RC delay and generating an ATD pulse. Further, due to the feed back, and as described above, the ATDBX_BA signal is again pulled low by the feedback circuit 1026 as described above. Therefore, the inputs which initiate the ATD pulse are subjected to a total of 2 RC delays.

In this way, the ATDBX_TA 326 and ATDBX_BA 328 signal paths are equalized in both loading (via the pulse signal loading equalization circuit 324) and in delay (parasitic capacitance and resistance) via the bridge circuit 304 to account for the differing input signal paths from the top and bottom of the integrated circuit. In the preferred embodiments, the PDAD and AI (21:17, 15:1) signal paths are each 12,000 $\mu$m long by 0.5 $\mu$m wide and are implemented in the metal 1 layer. The input buffers for signals originating from the bottom of the integrated circuit are physically located close to the corresponding transition detectors and therefore the associated signal paths are a negligible length. The total length of the bridge circuit is 12,000 $\mu$m long. It will be appreciated that these dimensions are implementation dependent and that longer or shorter paths may be used. In addition, other circuits comprising resistors, capacitors or other discrete devices may be used to equalize the signal paths.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. An address transition detector for a high density flash memory device, said flash memory device comprising a plurality of inputs and an array of single level flash memory cells, said address transition detector comprising:

first one or more signal transition detectors coupled with a first one or more of said plurality of inputs through a first one or more signal paths, each of said first one or more signal transition detectors operative to detect when a corresponding of said first one or more of said plurality of input signals transition and generate a first transition detect signal;

second one or more signal transition detectors coupled with a second one or more of said plurality of inputs through a second one or more signal paths, each of said second one or more signal transition detectors operative to detect when a corresponding of said second one or more of said plurality of input signals transition and generate a second transition detect signal;

a transition signal path coupled with said first one or more signal transition detectors and operative to transmit said first transition detect signal;

an equalization circuit coupled with said second one or more signal transition detectors and operative to transmit said second transition detect signal;

an address transition detect pulse generator coupled with said transition signal path and said equalization circuit and operative to receive said first and second transition detect signals and generate an address transition detect pulse wherein said address transition detector is located closer to said second one or more of said plurality of inputs than said first one or more of said plurality of inputs; and wherein said first one or more signal paths are characterized by a first delay and said equalization circuit is characterized by a second delay wherein said first delay is substantially equivalent to said second delay.

2. The address transition detector of claim 1, wherein said one or more signal paths are further characterized by a first length, wherein said first delay is a function of said first length.

3. The address transition detector of claim 2, wherein said equalization circuit comprises a feedback delay and a delay signal path characterized by a second length, wherein said second delay is a function of said second length, and further wherein said second length is substantially equivalent to said first length.

4. The address transition detector of claim 2, wherein said first length is characterized by a first resistance value and a first capacitance value, said equalization circuit comprising one or more resistors and one or more capacitors wherein said one or more resistors are characterized by a resistance value substantially equivalent to said first resistance value and said one or more capacitors are characterized by a capacitance value substantially equivalent to said first capacitance value.

5. An equalization circuit for equalizing the generation of an address transition detect signal for a high density flash memory device comprising an array of single level flash memory cells, said equalization circuit comprising:

a first receiver for receiving a first signal transition from a first signal input over a first signal path characterized by a first delay;

a second receiver for receiving a second signal transition from a second signal input over a second signal path characterized by a second delay, wherein said second delay is shorter than said first delay;

an equalizer coupled with said second receiver and operative to substantially equalize said first delay to said second delay.

6. The equalization circuit of claim 5, wherein said first signal path is further characterized by a first length, wherein said first delay is a function of said first length.

7. The equalization circuit of claim 6, wherein said second signal path is further characterized by a second length, wherein said second delay is a function of said second length and further wherein said equalizer comprises a feed back delay circuit and a third signal path coupled with said second signal path, said third signal path characterized by a third length, wherein said first length is about equal to the sum of said second length and said third length.

8. The equalization circuit of claim 5, wherein said first signal path is further characterized by a first capacitance value and a first resistance value, said second signal path is further characterized by a second capacitance value and a second resistance value, and said equalizer further comprises at least one resistor and capacitor having a third resistance value and a third capacitance value, wherein said first resistance value is substantially equal to the sum of said second and third resistance values and said first capacitance value is substantially equal to the sum of said second and third capacitance values.

9. A method of synchronizing the generation of an address transition detect signal for a high density flash memory device comprising an array of single level flash memory cells, said method comprising:

transmitting a first signal over a first signal pith characterized by a first delay;

transmitting a second signal over a second signal path characterized by a second delay, said second delay being less than said first delay; and equalizing said second delay and said first delay such that said first delay is substantially equivalent to said second delay.

10. The method of claim 9, wherein said equalizing further comprises transmitting said second signal over a third signal path coupled with said second signal path.

11. The method of claim 9, wherein said equalizing further comprises transmitting said second signal over a delayed feed back signal path coupled with said second signal path.

12. The method of claim 9, wherein said equalizing further comprises:

increasing the resistance of said second signal path; and
increasing the capacitance of said second signal path.

* * * * *